(12) United States Patent
Sugasawara

(10) Patent No.: US 6,221,681 B1
(45) Date of Patent: *Apr. 24, 2001

(54) ON-CHIP MISALIGNMENT INDICATION

(75) Inventor: Emery Sugasawara, Pleasanton, CA (US)

(73) Assignee: LSI Logic Corporation, Milpitas, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/150,076

(22) Filed: Sep. 9, 1998

Related U.S. Application Data

(62) Division of application No. 08/943,371, filed on Oct. 3, 1997, now Pat. No. 5,898,228.

(51) Int. Cl.[7] .................................................. H01L 21/66
(52) U.S. Cl. .............................................................. 438/14
(58) Field of Search ....................... 438/14, 17; 257/797, 257/528

(56) References Cited

U.S. PATENT DOCUMENTS

| | | |
|---|---|---|
| 3,808,527 * | 4/1974 | Thomas . |
| 5,617,340 * | 4/1997 | Creswell et al. . |
| 5,701,013 | 12/1997 | Hsia, et al. ........................ 250/491.1 |
| 5,753,391 | 5/1998 | Stone, et al. ........................... 430/22 |

FOREIGN PATENT DOCUMENTS

407029952 * 1/1995 (JP) .

OTHER PUBLICATIONS

Srivastava et al., "A Novel Electrical Test Structure for Measuring Misalignment Between Polysilicon and Active Area in MOS VLSI Technologies", Fourth CSI/IEEE International Symposium on VLSI Design, Jan. 1991, pp. 290–292.*

IBM Technical Disclosure Bulletin, NN84045896, Apr. 1984.*

* cited by examiner

Primary Examiner—Charles Bowers
Assistant Examiner—Evan Pert

(57) ABSTRACT

An on-chip misalignment indicator for measuring misalignment between layers of an integrated circuit die employs a first contact, and a second contact. A current path between the first and second contacts having a resistance that varies as a function of misalignment between successive layers of the integrated circuit die. Similarly, a method for detecting misalignment between layers of an integrated circuit die involves passing and measuring a current between a first contact. The amount of the current being indicative of an amount of misalignment between layers of the integrated circuit die.

9 Claims, 4 Drawing Sheets

ON-CHIP MISALIGNMENT INDICATION

This patent document is a Divisional patent application of U.S. patent application Ser. No. 08/943,371, filed Oct. 3, 1997, for ON-CHIP MISALIGNMENT INDICATION, now U.S. Pat. No. 5,898,228, incorporated herein by reference.

BACKGROUND OF THE INVENTION

The present invention relates to on-chip misalignment indication, and more particularly to such misalignment indication using misalignment circuit indicators. Even more particularly, the present invention relates to on-chip misalignment indication using misalignment circuit indicators fabricated in layers of an integrated circuit die wherein a current between two contacts varies as resistance between the contacts varies as a function of misalignment.

During fabrication of the integrated circuit die lithographic processes are used to lay down successive circuit layers that together define electronic devices on the integrated circuit die. Misalignment between successive layers of the integrated circuit die is present in all integrated circuit dies to some degree. There is, however, a tolerable amount of misalignment that may exist in any given integrated circuit die before operation of the integrated circuit die is jeopardized. If too much misalignment occurs between successive layers, the electronic devices will not function properly, i.e., will not function with desired specifications, or will prematurely fail.

Prior art approaches to establishing alignment involve the use of targets in a scribe line against which stencil-like masks for each of the layers are compared, and aligned prior to generating the layer using lithographic processes. Once the masks are aligned, exposed portions of the integrated circuit die are exposed, for example, to ultraviolet light, changing particular layer. Alignment of the mask is done by a machine to within angstroms of "perfect alignment". ("Perfect alignment" is perfectly in accordance with design.)

Visual observation using inspection hardware is presently used to verify the alignment of layers during and after fabrication. These visual inspection processes, however, are inherently imprecise and difficult to accurately quantify, and therefore improvements in alignment detection are needed.

Because obtaining accurate layer alignment indication or misalignment indication, as the case may be, in heretofore known integrated circuit dies is not possible, reliance must be made on techniques such as burn-in, and ultimately component failure, in order to assess whether significant enough misalignment between layers within an integrated circuit die exists from a performance perspective to cause device malfunction.

Presently, reliance on these visual inspection techniques and/or on indirect in-line measurements of component performance in order to determine whether misalignment is within tolerance is unacceptable. Because these approaches are either inexact, in the case of visual inspection, or indirect, in the case of in-line measurements of component performance, it is currently difficult or impossible to identify integrated circuit dies that contain latent misalignment defects (due to generally small amounts of misalignment), and thus reliable component failure predictions based on misalignment determinations cannot consistently be made.

What is needed is an approach for obtaining very accurate alignment information from an integrated circuit die in process development, product characterization, and in understanding different alignment sensitivities (tolerances). Further, what is needed is an approach in which very accurate quantifiable alignment information is obtained while minimizing the possibility of misinterpretation. An ability to gather large quantities of alignment information and to determine alignment during failure analysis would also be desirable. It also would be highly desirable if an acceptable and quantifiable amount of misalignment (misalignment tolerance) could be determined on an integrated-circuit-die-design-by-integrated-circuit-die-design basis, as opposed to present methods, which determine such misalignment amounts (or tolerances) on a technology-by-technology basis. Detection of misalignment after silicon wafers have been cut into individual dies is extremely difficult and impossible using prior art approaches, other than through failure analysis, however such an ability would be highly desirable. Furthermore, it would be useful to be able to determine misalignment trends in particular alignment hardware or in particular integrated circuit devices, which is not feasible using prior art techniques, because precise quantifiable misalignment data is not available, The present invention advantageously addresses the above, and other needs.

SUMMARY OF THE INVENTION

The present invention advantageously addresses the needs above as well as other needs, by providing an on-chip indication approach using misalignment circuit indicators fabricated in layers of an integrated circuit die.

The present approach employs, in its most basic form, a current path formed in layers of an integrated circuit between two electrical contacts. Resistance in the current path is a function of misalignment along at least one coordinate axis. As this resistance varies from misalignment to misalignment (i.e., from misaligned die to misaligned die), current flowing between the two contacts when a given voltage is applied across the contacts varies.

If misalignment is too far in a first direction, for example, the current path will have an increased conductance, i.e., a decreased resistance, and thus an increase in the amount of current passing between the two contacts for the given applied voltage. Similarly, misalignment in an opposite direction is characterized by a decrease in conductance, i.e., an increase in resistance, and thus a reduction in the amount of current passing between the two contacts at the given applied voltage.

Experimentation with varying degrees of misalignment results in a determination of a maximum and a minimum amount of current between the contacts at a given voltage. The maximum and minimum amounts of current correspond to maximum misalignments in the one and the others directions along the coordinate axis.

Thus the maximum and minimum amount of current define an acceptable range of misalignment between successive layers. If the amount of current between the two contacts is either greater than the maximum amount of current or less than the minimum amount of current for a given voltage applied between the two contacts, misalignment between successive layers is considered to be out of tolerance, and the integrated circuit die is considered to have failed misalignment testing.

Multiple current paths and corresponding contacts (i.e., multiple misalignment indicating structures) are preferably used on a given integrated circuit die. Some of these misalignment indicating structures misalignment are oriented to detect misalignment along a first coordinate axis, and other are oriented to detect misalignment along a second coordinate axis, which may be orthogonal to the first coordinate axis. Preferably, at least four or more misalignment indicating structures are used on each integrated circuit die.

Because the approach taught herein involves a simple application of voltage and a measurement of current, such approach can be quickly and automatically performed using a very simple test apparatus. Thus the present approach represents a significant improvement over prior art vision-based misalignment determination techniques, which are difficult to automate, and do not provide precise quantifiable misalignment information. Furthermore, the approach taught herein can be used before or after the integrated circuit die is cut, thus providing an additional advantage over the prior art vision-based techniques.

In one embodiment, the invention can be characterized as an on-chip misalignment indicator for measuring misalignment between layers of an integrated circuit die. The on-chip misalignment indicator employs a first contact; a second contact; and a current path between the two contacts having a resistance. In accordance with this embodiment, the resistance of the current path is a function of misalignment between successive layers of the integrated circuit die such that when a particular voltage is applied between the contacts, a resultant current is also a function of misalignment. Measurement of this current thus yields an indication of misalignment.

In a variation, the on-chip misalignment indicator has an active layer having an isolation region and a diffusion region, the first contact is coupled to a first portion of the diffusion region, and the second contact is coupled to a second portion of the diffusion region. The isolation region is interposed between (i.e., separates) the first portion of the diffusion region and the second portion of the diffusion region. Together, the first and second portions of the active region, and the isolation region make up the current path. Variation in resistance of the current path is a function of how closely the first and second contacts are to the edge of their respective portions of the active region. As the contacts are placed closer to the edge of their portions of the diffusion region, resistance of this current path decreases, and vice versa, as these contacts are placed further from the edge of their respective portions of the diffusion region, their resistance increases. Thus, at "perfect alignment", i.e., desired, or optimal, alignment between the contacts, i.e., a contact layer, and the isolation and diffusion regions of the active layer, the current path will have a particular resistance, and thus a particular current at a particular voltage. As alignment deviates from "perfect alignment" this resistance varies, and thus the current resulting from a particular voltage varies. Through experimentation a range of acceptable currents (and thus a range of acceptable misalignment) may be determined.

In a further variation, the on-chip misalignment indicator has a third contact; a fourth contact; and another current path between the third and fourth contacts having another resistance. The other resistance is also a function of misalignment between the contact layer and the active layer of the integrated circuit die. The further variation also includes a fifth contact; a sixth contact; and a further current path between the fifth and sixth contacts having a further resistance. The further resistance is a function of misalignment between successive layers of the integrated circuit die, and together the current path, the other current path and the further current path, by virtue of their resistances that are functions of misalignment, indicate a degree of misalignment, if any.

In another variation, the on-chip misalignment indicator has an active layer having a diffusion region, a first contact, which in this other variation is coupled to the diffusion region, and a second contact, which in this other variation is also coupled to the diffusion region; and a polygate layer having a polygate region. The polygate region, when viewed from above, is interposed between the first contact and the second contact and a current gap is formed at one edge of the diffusion region between one end of the polygate region and the edge of the diffusion region. The current gap has a width that is a function of misalignment between the active layer and the polygate layer thus causing current between the first contact and the second contact to be a function of misalignment, as with the above variation.

In another embodiment, the invention can be characterized as a method for detecting misalignment between layers of an integrated circuit die. The method involves applying a voltage across a first contact and a second contact using a voltage supply; and measuring an amount of the current using a current measuring device. The amount of the current is indicative of an amount of resistance, which is in turn indicative of an amount of misalignment between layers of the integrated circuit die.

In a variation, the method involves, determining whether the amount of the current is outside a prescribed tolerance, i.e., is more than a maximum tolerable current or less than a minimum tolerable current, such as by using a special or general purpose computer, or such as by using a meter, a gauge, a light, an audible alarm or the like. The integrated circuit die is rejected in the event the amount of current is outside the prescribed tolerance.

BRIEF DESCRIPTION OF THE DRAWINGS

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE PREFERRED EMBODIMENTS

The following description of the presently contemplated best mode of practicing the invention is not to be taken in a limiting sense, but is made merely for the purpose of describing the general principles of the invention. The scope of the invention should be determined with reference to the claims.

Figure 1:
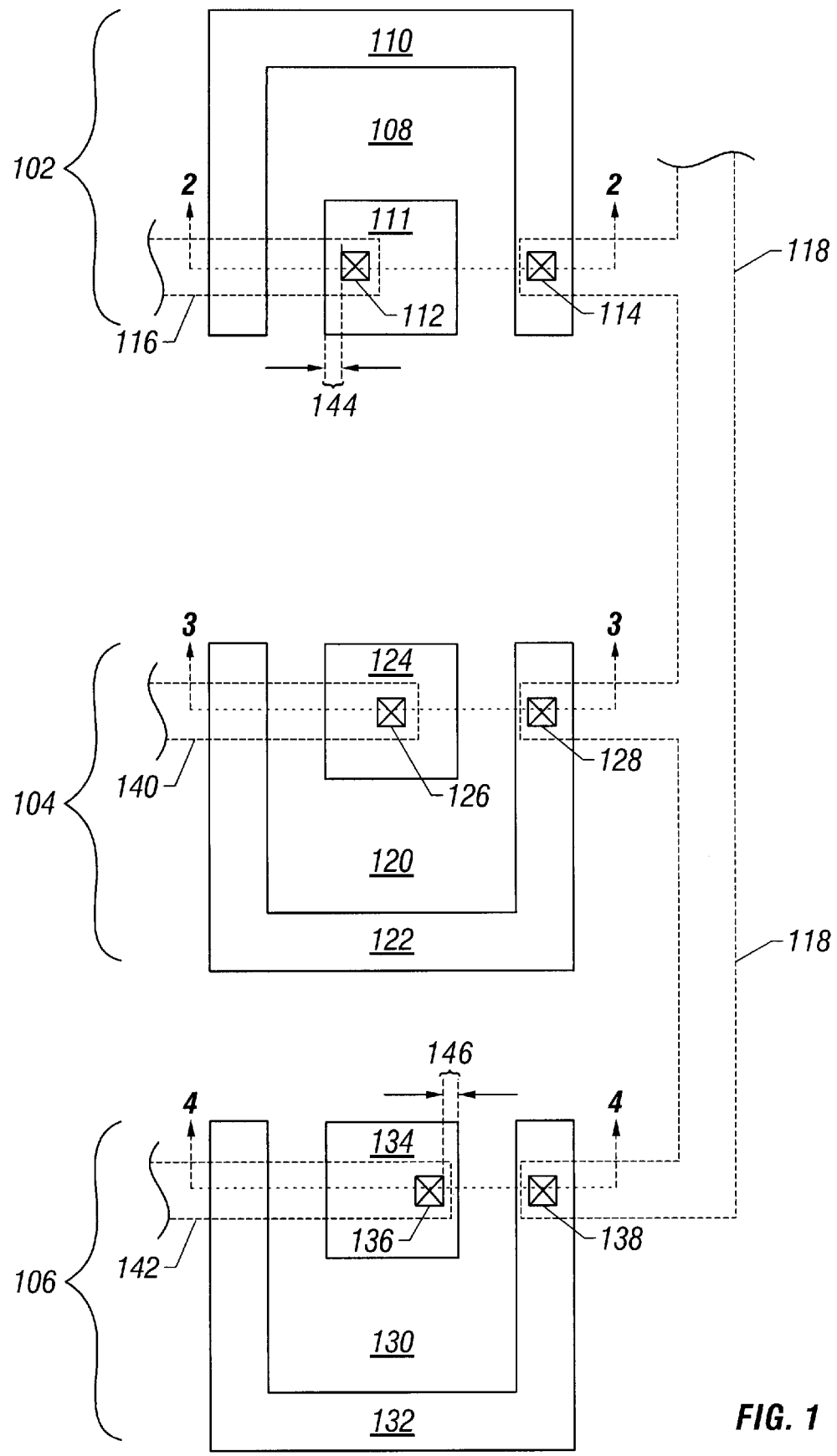
FIG. 1 is a layout view of an approach for determining layer misalignment between a contact layer and an active layer of an integrated circuit die in an x direction (horizontal direction as oriented in FIG. 1) using on-chip misalignment circuit indicators in accordance with one embodiment of the present invention.

Referring to FIG. 1, a layout view is shown of an approach for measuring layer misalignment between a contact layer and an active layer of an integrated circuit die in an x direction (horizontal direction as oriented in FIG. 1) using on-chip misalignment circuit indicators in accordance with one embodiment of the present invention. Shown is a trio of on-chip misalignment indicators 102, 104, 106, from which precise x direction misalignment information can be obtained. A first on-chip misalignment indicator 102 consists of an isolation region 108 and diffusion regions 110, 111 of an active layer, and contact regions 112, 114 of a contact layer. Also shown is a conductor 116 connecting a first contact region 112 to a pad "A" (not shown), and another conductor 118 connecting a second contact region 114 to a pad "D" (not shown). A second on-chip misalignment indicator 104 has a similar isolation region 120 and diffusion regions 122, 124 in the active layer, and contact regions 126, 128 in the contact layer, as does a third on chip misalignment indicator 106 (also with an isolation region 130 and diffusion regions 132, 134 in an active layer, and contact regions 136, 138 in a contact layer). Also shown is a conductor 140 connecting a third contact region 126 of the second on-chip misalignment indicator 104 to pad "B" (not shown), the connector 118 connecting the fourth contact region of the second on-chip misalignment indicator 104 to pad "D" (not shown), a connector 142 connecting the fifth contact region 136 of the third on-chip misalignment indicator 106 to pad "C" (not shown), and the connector 118 to the sixth contact region 138 of the third on-chip misalignment indicator 106 to pad "D".

Each of the on-chip misalignment indicators 102, 104, 106 may be any type of appropriate semiconductor device in which the current path through the device varies dependent upon the length, and hence the resistance, between locations in the device. For example, as shown in FIG. 1, each of the on-chip misalignment indicators is essentially a MOSFET leakage device (without a "gate", per se).

As can be seen, each of the three on-chip misalignment indicators 102, 104, 106 is slightly offset with respect to the remaining indicators 102, 104, 106 with critical distances 144, 146 defined in each direction on an x coordinate axis (left and right) by the first on-chip misalignment indicator 102 and the third on-chip misalignment indicator 106. The critical distances can also be seen in FIGS. 2, 3 and 4, which are cross-sectional views of the on-chip misalignment indicators 102, 104, 106, respectively. (In FIGS. 2, 3 and 4, "OX" indicates oxide regions, which form the isolation region, "n+" indicates doped regions, which form the diffusion region, and cross hatching indicates metal regions, which form the contact pads 112, 114, 126, 128, 136, 138, and conductors 116, 118, 140, 142.)

A prescribed amount of current flows between the contact pads 112 and 114, 126 and 128, 136 and 138 of each of the on-chip misalignment indicators 102, 104, 106 when a proper alignment in the x direction is achieved. When misalignment occurs, this prescribed current will increase or decrease between contact pads 112, 114, 126 and 128 and 136, 138 of each of the on-chip misalignment indicators 102, 104, 106 as a function of an amount of, and direction of, misalignment. Current measurements can be made by known current measuring devices, such as an ammeter, and determination of whether such current measurements are within a prescribed tolerance can be made using, for example, a special or general purpose computer, a meter, a gauge, a light that illuminated when such current measurement is out of tolerance, or an audible alarm that sounds when such current is out of tolerance. In variation employing, for example, a light or an audible alarm, a comparator circuit, such as is commonly known in the field of electronics, can be used to drive the light or audible alarm.

Figure 2:
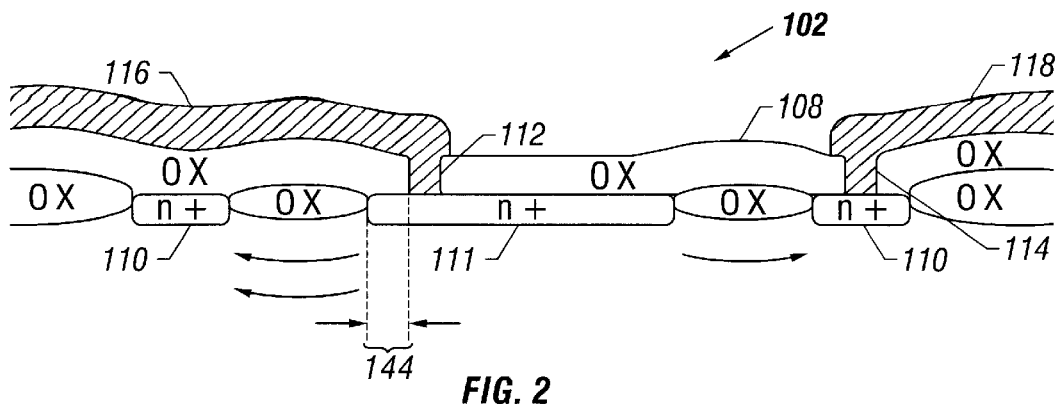
FIGS. 2, 3, and 4 are side cross-sectional views of the on-chip misalignment structure shown in FIG. 1.
Figure 3:
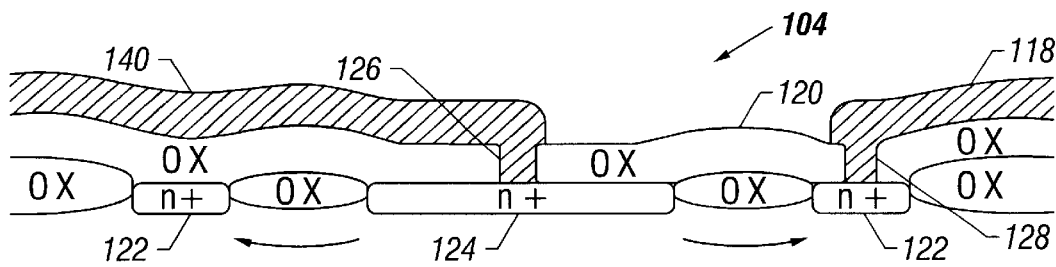
Figure 4:
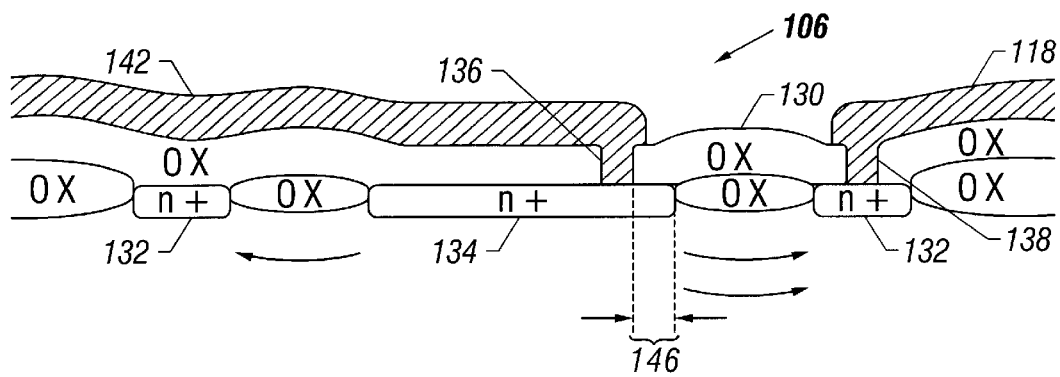

Current flowing in the current paths defined by the on-chip misalignment indicators is depicted using arrows in FIGS. 2, 3 and 4, with greater current being depicted using two arrows, and lesser current being depicted using single arrows. As alignment shifts, the relationships of these currents to one another vary, as do their magnitudes with respect to reference magnitudes, and tolerances.

In this way, precise measurements of misalignment and determinations of whether such misalignment is within a prescribed tolerance can be made. Practical experience, and testing can serve to develop tolerance figures for each of the currents, so that the precise determinations can be made as to whether misalignment in any given integrated circuit die will result in integrated chip failure, either immediately or after sustained usage.

Allowance is made in positioning the on-chip misalignment indicators 102, 104, 106 on the integrated circuit die so that integrated circuit die performance is not compromised. Specifically, critical output pads are not used for connection to the on-chip misalignment indicators 102, 104, 106, and critical circuit routing metal may be routed around the on-chip misalignment indicators 104, 104, 106, if necessary. Die size is not affected because only open areas on the integrated circuit die are used, such as is typically available near the pads. (See FIG. 9, and discussion below) A maximum number of misalignment circuit indicators on a given integrated circuit die is desirable so that a maximum detail may be achieved in the indication of alignment or misalignment. Existing pads of the integrated circuit chip are employed, thus not necessitating additional pads, but the pads are multiplexed or otherwise isolated, so that chip performance is not affected by the presence on-chip misalignment indicators 102, 104, 106. Avoidance of unwanted leakage current between two or more active pads is also desirable.

In accordance with the present embodiment, a minimum of four pads is used for each trio of misalignment circuit indicators, in this case pads connected to each of the four conductors 116, 118, 140, 142. Thus, as many as 99 misalignment circuit indicators at various layers can be propagated onto a 399 I/O pin package/device, i.e., 25 per side. In most cases however, less than this number will be allowable since some pads will be used for critical output pads, such as critical path measurements, or analog type or other special use pins, and therefore cannot be used for connection to the on-chip misalignment indicators 102, 104, 106.

As mentioned above, for a given integrated circuit die, any misalignment between layers results in a variation in currents between the contact pads 112, 114, 126, 128, 136, 138 of the trio of on-chip misalignment indicators 102, 104, 106. In FIG. 1, alignment between the contact mask (i.e., a mask used to create the contact layer between a first layer of metal and either polysilicon or a diffusion layer) and an active layer is measured as a function of current flowing between an edge of a contact 112, 126, 136 of each of the on-chip misalignment indicators 102, 104, 106 and an edge of a field oxide encroachment, i.e., the respective isolation regions 108, 120, 130. This leakage is conducted through the isolation region 108, 120, 130 and to another contact 114, 128, 138 of each of the on-chip misalignment indicators 102, 104, 108, and is a function of resistance between the contacts 112, 126, 136 and the other contacts 114, 128, 138. In other words, leakage current between the contacts 112, 126, 136 and the other contacts 114, 128, 138 is a function of resistance, which is in turn a function of misalignment or alignment.

If alignment between the contact layer and the active layer is within tolerance, this leakage current will be within an acceptable range as determined by practical experience and other known testing methodologies. Whenever misalignment exceeds tolerance, this leakage current will be outside the acceptable range, and the die will be considered misaligned and rejected. For example, in the trio of on-chip misalignment indicators 102, 104, 106 of the present embodiment, if the contact layer were shifted in the positive x direction (to the right) relative to the active layer, one would expect that leakage current in the first on-chip misalignment indicator 102 (see also FIG. 2) would decrease, because the first contact 112 would be positioned further from an edge of the respective diffusion region 111. One would also expect the leakage current to increase in both the second on-chip misalignment indicator 104 (FIG. 3), and the third on-chip misalignment indicator 106 (FIG. 4), because the respective contacts 126, 136 would be positioned closer to an edge of the respective diffusion regions 124, 134. If instead misalignment were in the negative x direction (toward the left), then one would expect that less current would flow between the contacts 136, 138 of the third on-chip misalignment indicator 106 (FIG. 4) and more current would flow between the contacts 112 and 114, 126 and 128 of the first and second on-chip misalignment indicators (FIGS. 2 and 3).

Other layers may have trios of on-chip misalignment indicators, such as described hereinbelow, that are structurally different than the above embodiment, but that function similarly. Other trios of on-chip misalignment indicators (not shown) on the active and contact layers may be oriented at a 90° rotation relative to the present embodiment so as to detect misalignment in a y direction (or vertical direction as depicted in FIG. 1). Preferably at least four more trios of on-chip misalignment indicators are used, two or more of which are oriented to detect misalignment in the x direction, and two or more of which are oriented to detect misalignment in a y direction.

Figure 5:
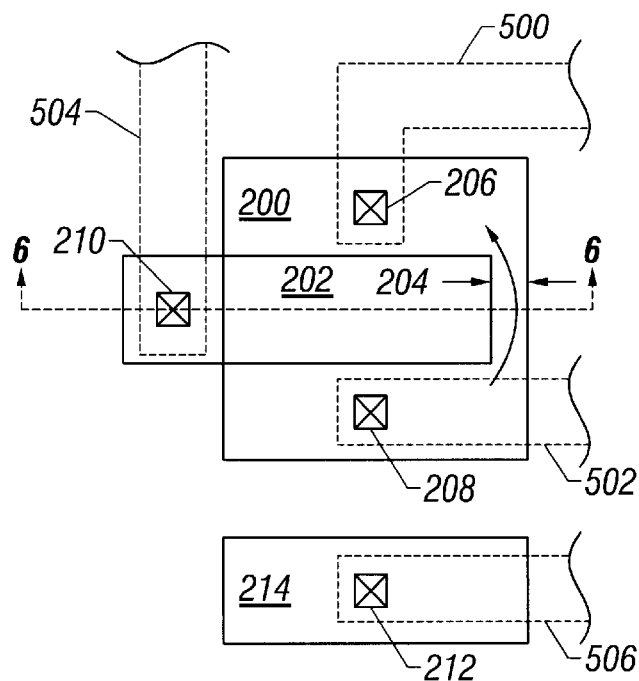
FIG. 5 is a layout view of another approach for determining layer misalignment between active layer and polygate layer of an integrated circuit die in an x direction (horizontal direction as oriented in FIG. 5) using an on-chip misalignment indicator in accordance with another embodiment of the present invention.
Figure 6:
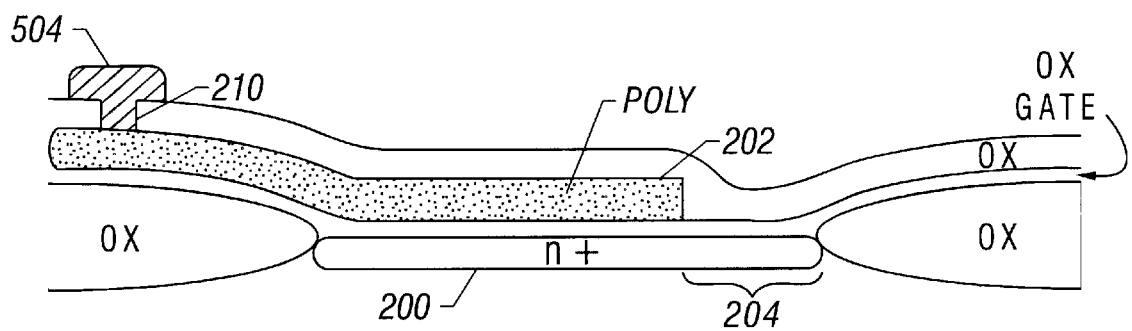
FIG. 6 is a side cross-sectional view of the on-chip misalignment structure shown in FIG. 5.

Referring next to FIG. 5 shown is an active region 200 of an active layer over which a polygate region 202 of a polygate layer passes (see FIG. 6), leaving a small current gap 204 for passage of current from one contact 206 on the active region 200 to another contact 208 on the active region 200, with the polygate region 202 being interposed thereinbetween such that current (represented with an arrow in FIG. 5) is concentrated in the small current gap 204. A third contact 210 is connected to the polygate region 202, with a fourth contact 212 being on a substrate tap 214, such as is known in the art. The present embodiment on-chip misalignment indicator is designed to detect misalignment in the x direction (i.e., horizontal direction as oriented in FIGS. 5 and 6). (In FIG, 6, "OX" indicates oxide regions, "n+" indicates doped regions, which form the active region 200, dotting and "POLY" indicate the polygate region 202 and cross-hatching indicates metal regions, which form the contact pads 206, 208, 210, 212, and conductors 500, 502, 504, 506.)

The on-chip misalignment indicator may be any type of appropriate semi-conductor device in which the current path through the device varies dependent upon the length, and hence the resistance, between locations in the device. For example, as shown in FIG. 5, the on-chip misalignment indicator is similar to a MOSFET device, with the polygate region 202 serving as the gate.

In practice, for example, if the polygate layer is aligned too far in the positive x direction (to the right), the current gap 204 (FIG. 6) gets smaller, thus acting to decrease current between the first contact pad 206 on the active region 200 and the second contact pad 208 on the active region 200. Similarly, if the polygate layer is aligned too far in the negative x direction (to the left), an increased level of current will be observed between the first contact pad 206 on the active region 200 and the second contact pad 208 on the active region 200. In this way, as with the embodiment described above, the amount and direction of x direction misalignment can be detected using the on-chip misalignment indicator shown.

Figure 7:
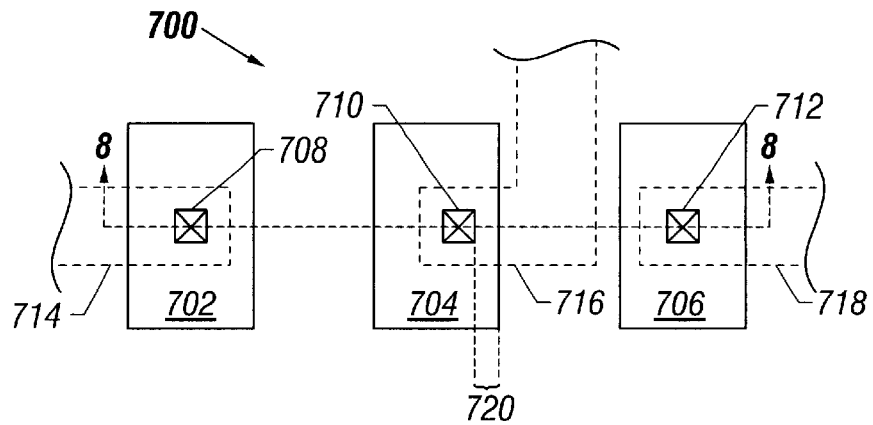
FIG. 7 is a layout view of a further approach for determining layer misalignment between the contact layer and the active layer of an integrated circuit die in an x direction (horizontal direction as oriented in FIG. 7) using on-chip misalignment circuit indicators in accordance with a further embodiment of the present invention.

Referring next to FIG. 7, a layout view is shown of a further approach for determining layer misalignment between the contact layer and the active layer of an integrated circuit die in an x direction (horizontal direction as oriented in FIG. 7) using on-chip misalignment circuit indicators in accordance with one embodiment of the present invention. Shown are an isolation region 700, a first portion of diffusion region 702, a second portion of diffusion region 704, a third portion of diffusion region 706, a first contact 708, a second contact 710, and a third contact.

The first contact is 708 positioned on the first portion of diffusion region 702; the second contact 710 is positioned on the second portion of diffusion region 704 and the third contact 712 is positioned on the third portion of diffusion region 706.

As can be seen, the second contact 710 slightly offset with respect to the second diffusion region 704 with a critical distance 720 defined as indicated. The critical distance 720 can also be seen in FIG. 8, which is a cross-sectional view of the on-chip misalignment indicator of FIG. 7. (In FIG. 8, "OX" indicates oxide regions, which form the isolation region 700, "n+" indicates doped regions, which form the diffusion regions 702, 704, 706, and cross hatching indicates metal regions, which form the contact pads 708, 710, 712 and conductors 714, 716, 718.)

A prescribed amount of current flows between the contact pads 708, 710, 712 when a proper alignment in the x direction is achieved. When misalignment occurs, this prescribed current will increase or decrease between contact pads 708, 710, 712 as a function of an amount of, and direction of, misalignment. Current measurements can be made by known current measuring devices and determination of whether such current measurements are within a prescribed tolerance can be made.

Figure 8:
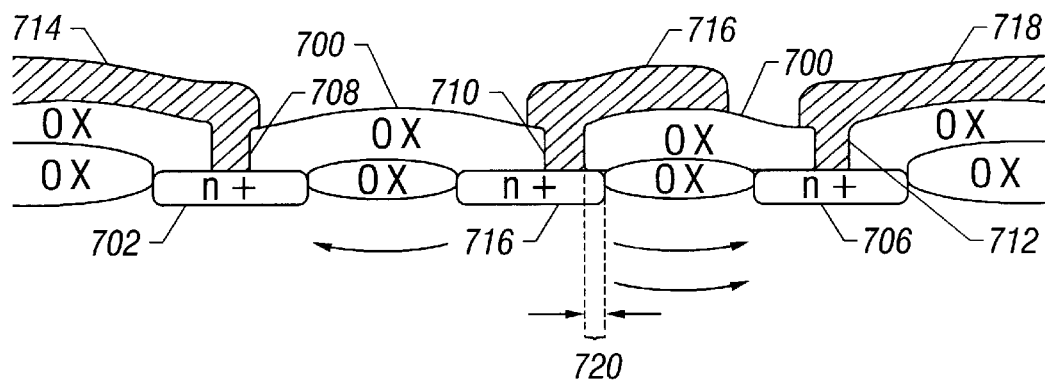
FIG. 8 is a side cross-sectional view of the on-chip misalignment structure of FIG. 7.

Currents flowing in the current paths depicted using arrows in FIG. 8, with greater current being depicted using two arrows, and lesser current being depicted using a single arrow. As alignment shifts, the relationships of these currents to one another vary, as do their magnitudes with respect to reference magnitudes, and tolerances.

In the embodiment shown, alignment between the contact mask (i.e., a mask used to create the contact layer between a first layer of metal and either polysilicon or a diffusion layer) and an active layer is measured as a function of currents flowing between the second contact 708 and an edge of a field oxide encroachment, i.e., the isolation region 700. These leakage currents are conducted through the isolation region 700 and to the first and third contacts 708, 712, respectively. These leakage currents are a function of resistance between the second contact 710 and the first and third contacts 708, 712, respectively. In other words, leakage current between the second contact 710 and the first and third contacts 708, 712 is a function of resistance, which is in turn a function of misalignment or alignment.

If alignment between the contact layer and the active layer is within tolerance, these leakage currents will be within corresponding acceptable ranges as determined by practical experience and other known testing methodologies. Whenever misalignment exceeds tolerance, one or both of these leakage currents will be outside their acceptable range, and the die will be considered misaligned and rejected. For example, if the contact layer were shifted in the positive x direction (to the right) relative to the active layer, one would expect that leakage current (see also FIG. 8) between the first contact 708 and the second contact 710 would decrease, because the second contact 710 would be positioned further from an edge of the respective diffusion region 704, as seen by the first contact 708. One would also expect the leakage current to increase between the third contact 712 and the second contact 710, because the second contact 710 would be positioned closer to an edge of the respective diffusion region 704, as seen by the third contact 712. If instead, misalignment were in the negative x direction (toward the left), then one would expect that leakage current (see also FIG. 8) between the first contact 708 and the second contact 710 would increase, because the second contact 710 would be positioned closer to an edge of the respective diffusion region 704, as seen by the first contact 708. One would also expect the leakage current to increase between the third contact 712 and the second contact 710, because the second contact 710 would be positioned further from an edge of the respective diffusion region 704, as seen by the third contact 712.

Figure 9:
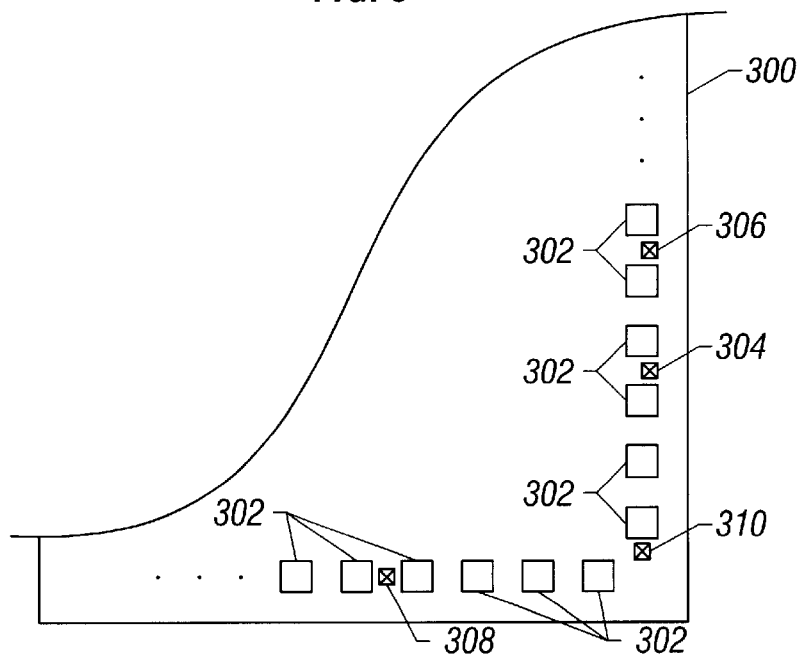
FIG. 9 is a layout view of an exemplary integrated circuit die indicating possible locations for on-chip misalignment indicators of the types shown in FIGS. 1, 5 and 7.

Referring next to FIG. 9, shown is an integrated circuit die 300, a plurality of contact pads 302 at a periphery of the integrated circuit die 300, and a plurality of on-chip misalignment indicators 304, 306, 308 located between and near the contact pads 302, such as could typically be the case with commonly used integrated circuit dies, which generally have unused regions near the contact pads 302. As mentioned above, it is important to avoid placing the on-chip misalignment indicators 304, 306, 308 near critical structures or in other positions where their presence may effect overall circuit performance on the integrated circuit die 300. As will be appreciated by the skilled artisan, the plurality of on-chip misalignment indicators 304, 306, 308, 310 will include on-chip misalignment indicators oriented to detect misalignments in an x direction (horizontal, as oriented in FIG. 3), and also include on-chip misalignment indicators oriented to detect misalignments in a y direction (vertical, as oriented in FIG. 3). Preferably, as shown, at least four or more on-chip misalignment indicators 304, 306, 308, 310 are employed, with at least two or more on-chip misalignment indicators 304, 308 oriented to detect misalignment in the x direction, and at least two or more on-chip misalignment indicators 306, 310 oriented to detect misalignment in the y direction.

While the invention herein disclosed has been described by means of specific embodiments and applications thereof, numerous modifications and variations could be made thereto by those skilled in the art without departing from the scope of the invention set forth in the claims.

What is claimed is:

1. A method for detecting misalignment between layers of an integrated circuit die, the method comprising the steps of:

passing a first current between a first contact and a second contact including passing the current under an isolation structure interposed between the first contact and the second contact, the isolation structure being in an active layer and the first and second contact being in a metal layer, the amount of the current varying as a function of misalignment between said metal layer and said active layer of the integrated circuit die;

measuring an amount of the first current, the amount of the first current being indicative of an amount of misalignment between said layers of the integrated circuit die; and determining whether said amount of the first current is outside a prescribed tolerance.

2. The method of claim 1 wherein the step of passing the first current between the first and second contacts comprises:

passing a first current through the active layer, the active layer having a diffusion region, the first contact being coupled to a first portion of the diffusion region, and the second contact being coupled to a second portion of the diffusion region, the isolation structure being interposed between the first portion of the diffusion region and the second portion of the diffusion region, said amount of first current varying as a function of misalignment between the active layer and the metal layer.

3. The method of claim 1 wherein the step of passing the first current between said first and second contacts comprises:

passing the first current through an active layer, the active layer having an isolation region structure and a diffusion region, the first contact being coupled to a first portion of the diffusion region, and the second contact being coupled to a second portion of the diffusion region, the isolation structure being interposed between the first portion of the diffusion region and the second portion of the diffusion region.

4. The method of claim 1 further comprising the steps of:

passing a second current between a third contact and a fourth contact comprising passing the second current under the isolation structure, the isolation structure being interposed between the third contact and the fourth contact;

passing a third current between a fifth contact and a sixth contact, comprising passing said third current under the isolation structure, the isolation structure being interposed between the fifth contact and the sixth contact.

5. The method of claim 4 further comprising the steps of:

measuring an amount of the second current, the amount of the second current being further indicative of the amount of misalignment between layers of the integrated circuit die;

measuring an amount of the third current, the amount of the third current being further indicative of the amount of misalignment between layers of the integrated circuit die;

determining whether said amount of the second current is outside a second prescribed tolerance; and determining whether said amount of the third current is outside a third prescribed tolerance.

6. The method of claim 5 wherein the steps of passing the first current, passing the second current, and passing the third current comprise:

passing the first current, the second current and the third current through an active layer, the active layer including a diffusion region, the first, third and fifth contacts being coupled to first respective portions of the diffusion region, and the second, fourth and sixth contacts being coupled to second respective portions of the diffusion region, the isolation structure being interposed between the respective first portions of the diffusion region and the respective second portions of the diffusion region.

7. The method of claim 4 wherein;

said step of passing the second current between the third contact and the fourth contact comprises passing the second current through another isolation region interposed between the third contact and the fourth contact said another isolation structure being in the active layer and the third and fourth contacts being in the metal layer; and said step of passing the third current between the fifth contact and the sixth contact comprises passing the third current through a further isolation structure interposed between the fifth contact and the sixth contact, the further isolation structure being in the active layer and the fifth and sixth contacts being in the metal layer, the isolation region, said another isolation structure and the further isolation structure conducting the first current, the second current and the third current in respective amounts varying as a function of misalignment between the metal layer and the active layer.

8. The method of claim 5 wherein the step of passing the first current between the first and second contacts comprises:

passing the first current through the active layer, wherein the active layer includes a diffusion region, the first contact being coupled to a first portion of the diffusion region, and the second contact being coupled to a second portion of the diffusion region, the isolation structure being interposed between the first portion of the diffusion region and the second portion of the diffusion region, said amount of the first current varying as a function of misalignment between the active layer and the metal layer.

9. The method of claim 8 wherein:

said step of passing the second current comprises passing the second current through the active layer, the third contact being in the metal layer and being coupled to a third portion of the diffusion region, and the fourth contact being in the metal layer and being coupled to a fourth portion of the diffusion region, the isolation structure being interposed between the fourth portion of the diffusion region and the third portion of the diffusion region, said amount of the second current varying as a function of misalignment between the active layer and the metal layer; and said step of passing the third current comprises passing the third current through the active layer, the fifth contact being in the metal layer and being coupled to a fifth portion of the diffusion region, and the sixth contact being in the metal layer and being coupled to a sixth portion of the diffusion region, the isolation structure being interposed between the fifth portion of the diffusion region and the sixth portion of the diffusion region, said amount of the third current varying as a function of misalignment between the active layer and the metal layer.

* * * * *